US009171774B2

(12) United States Patent
Shiramizu et al.

(10) Patent No.: US 9,171,774 B2
(45) Date of Patent: Oct. 27, 2015

(54) POWER SEMICONDUCTOR MODULE AND METHOD OF MANUFACTURING THE SAME

(71) Applicant: MITSUBISHI ELECTRIC CORPORATION, Tokyo (JP)

(72) Inventors: Masataka Shiramizu, Tokyo (JP); Ming Shang, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/027,014

(22) Filed: Sep. 13, 2013

(65) Prior Publication Data
US 2014/0131846 A1    May 15, 2014

(30) Foreign Application Priority Data

Nov. 15, 2012    (JP) ................................ 2012-251225

(51) Int. Cl.
*H01L 23/495*    (2006.01)
*H01L 23/373*    (2006.01)
*H01L 23/433*    (2006.01)

(52) U.S. Cl.
CPC ........ *H01L 23/3735* (2013.01); *H01L 23/4334* (2013.01); *H01L 23/49562* (2013.01); *H01L 23/49575* (2013.01); *H01L 2224/48091* (2013.01); *H01L 2224/48137* (2013.01);
(Continued)

(58) Field of Classification Search
CPC ........... H01L 2224/48247; H01L 2224/48091; H01L 2224/01079; H01L 2224/01078; H01L 2224/01029; H01L 23/3735; H01L 23/49575; H01L 23/4334; H01L 23/49562; H01L 2924/1305

USPC .................. 257/666, 669, 670, 671, 676, 784
See application file for complete search history.

(56) References Cited

U.S. PATENT DOCUMENTS

2003/0075783 A1    4/2003    Yoshihara et al.
2006/0056213 A1    3/2006    Lee et al.
(Continued)

FOREIGN PATENT DOCUMENTS

JP    H09-186269 A    7/1997
JP    H09-283681 A    10/1997
(Continued)

OTHER PUBLICATIONS

An Office Action; "Grounds for Rejection," issued by the Korean Patent Office on Jul. 30, 2014, which corresponds to Korean Patent Application No. 10-2013-0135224 and is related to U.S. Appl. No. 14/027,014; with English language translation.
(Continued)

*Primary Examiner* — Hoa B Trinh
(74) *Attorney, Agent, or Firm* — Studebaker & Brackett PC (57) ABSTRACT

A power semiconductor module has a first frame portion, a power semiconductor element, a second frame portion, a control integrated circuit, a wire, and an insulator portion. The power semiconductor element is mounted on a first surface of the first frame portion. The control integrated circuit is mounted on a third surface of the second frame portion for controlling the power semiconductor element. A wire has one end connected to the power semiconductor element and the other end connected to the control integrated circuit. The first surface of the first frame portion and the third surface of the second frame portion are located at the same height in a direction vertical to the first surface of the first frame portion.

9 Claims, 9 Drawing Sheets

(52) U.S. Cl.
CPC ............... *H01L2224/48247* (2013.01); *H01L 2924/1305* (2013.01); *H01L 2924/13055* (2013.01)

(56) References Cited

U.S. PATENT DOCUMENTS

| | | | |
|---|---|---|---|
| 2008/0054422 A1 | 3/2008 | Koike et al. | |
| 2009/0218666 A1 | 9/2009 | Yang | |
| 2014/0001611 A1* | 1/2014 | Jo et al. | 257/666 |

FOREIGN PATENT DOCUMENTS

| | | |
|---|---|---|
| JP | 2003-124437 A | 4/2003 |
| JP | 2005-005638 A | 1/2005 |
| JP | 2005-150595 A | 6/2005 |
| JP | 2006-080300 A | 3/2006 |
| JP | 2008-060256 A | 3/2008 |
| KR | 2003-0032816 A | 4/2003 |
| KR | 2006-0017711 A | 2/2006 |
| KR | 2009-0093163 A | 9/2009 |
| WO | 2009/110376 A1 | 9/2009 |

OTHER PUBLICATIONS

An Office Action; "Notice of Allowance," issued by the Korean Patent Office on Feb. 27, 2015, which corresponds to Korean Patent Application No. 10-2013-0135224 and is related to U.S. Appl. No. 14/027,014; with English language translation.

An Office Action; "Notice of Grounds of Rejection," issued by the Japanese Patent Office on Jul. 28, 2015, which corresponds to Japanese Patent Application No. 2012-251225 and is related to U.S. Appl. No. 14/027,014; with English language translation.

\* cited by examiner

POWER SEMICONDUCTOR MODULE AND METHOD OF MANUFACTURING THE SAME

BACKGROUND OF THE INVENTION

1. Field of the Invention

The present invention relates to a power semiconductor module and a method of manufacturing the same, and more particularly to a power semiconductor module having a wire connecting a power semiconductor element and a control integrated circuit with each other, and a method of manufacturing the same.

2. Description of the Background Art

Power semiconductor modules are conventionally known, for example, in which a power semiconductor element such as an IGBT (Insulated Gate Bipolar Transistor) and a control integrated circuit for controlling the power semiconductor element are connected with each other by a wire. For example, Japanese Patent Laying-Open No. 2005-150595 discloses a power semiconductor device in which a power chip and a control chip are connected by a wire mainly composed of gold. In the power semiconductor device, in order to achieve both of heat dissipation from the power chip and insulation of the terminal, a frame mounted with the power chip is in contact with an insulating sheet located on the outer periphery of a package, and a frame mounted with the control chip is located at the central portion of the package.

SUMMARY OF THE INVENTION

In the power semiconductor device with the configuration as described above, however, strong stress is exerted on an end portion of the wire that connects the power semiconductor element with the control integrated circuit because of a large step height difference between the power semiconductor element and the control integrated circuit, possibly causing a disconnection of the wire or a shirt circuit.

The present invention is made in view of the foregoing problem. An object of the present invention is to provide a power semiconductor device and a method of manufacturing the same, in which a wire loop is stabilized by alleviating stress exerted on an end portion of a wire, thereby preventing a disconnection of the wire or a short circuit.

A power semiconductor module according to the present invention includes a first frame portion, a power semiconductor element, a second frame portion, a control integrated circuit, a wire, and an insulator portion. The first frame portion has a first surface and a second surface opposed to each other. The power semiconductor element is mounted on the first surface of the first frame portion. The second frame portion has a third surface and a fourth surface opposed to each other. The control integrated circuit is mounted on the third surface of the second frame portion for controlling the power semiconductor element. The wire has one end and the other end, the one end is connected to the power semiconductor element, and the other end is connected to the control integrated circuit. The insulator portion seals the power semiconductor element, the first frame portion, the control integrated circuit, the second frame portion, and the wire. The first surface of the first frame portion and the third surface of the second frame portion are located at a same height in a direction vertical to the first surface of the first frame portion. Here, the same height means that the distance between the first surface and the third surface is 0.1 mm or less in the direction vertical to the first surface.

The present invention provides a power semiconductor device and a method of manufacturing the same, in which a wire loop is stabilized by alleviating stress exerted on an end portion of a wire, thereby preventing a disconnection of the wire or a short circuit.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, embodiments of the present invention will be described based on the drawings. The same or corresponding parts are denoted with the same reference numerals in the drawings, and a description thereof will not be repeated.

First Embodiment

Figure 1:
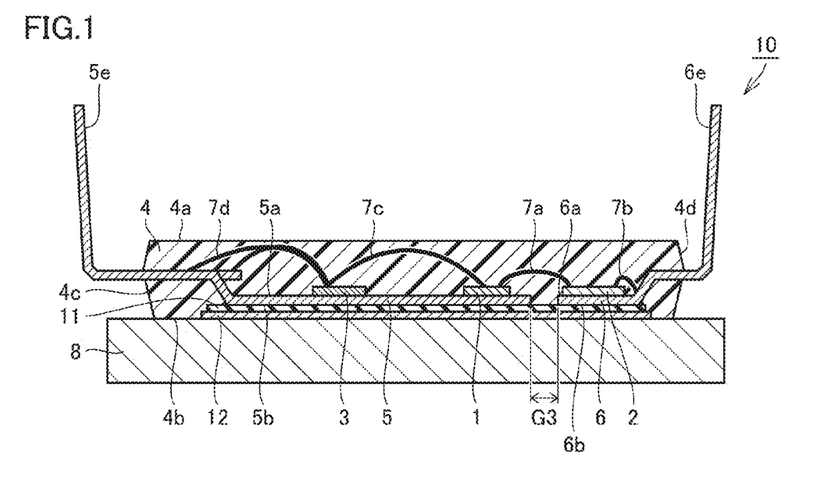
FIG. 1 is a cross-sectional diagram schematically illustrating a configuration of a power semiconductor device according to a first embodiment of the present invention.
Figure 2:
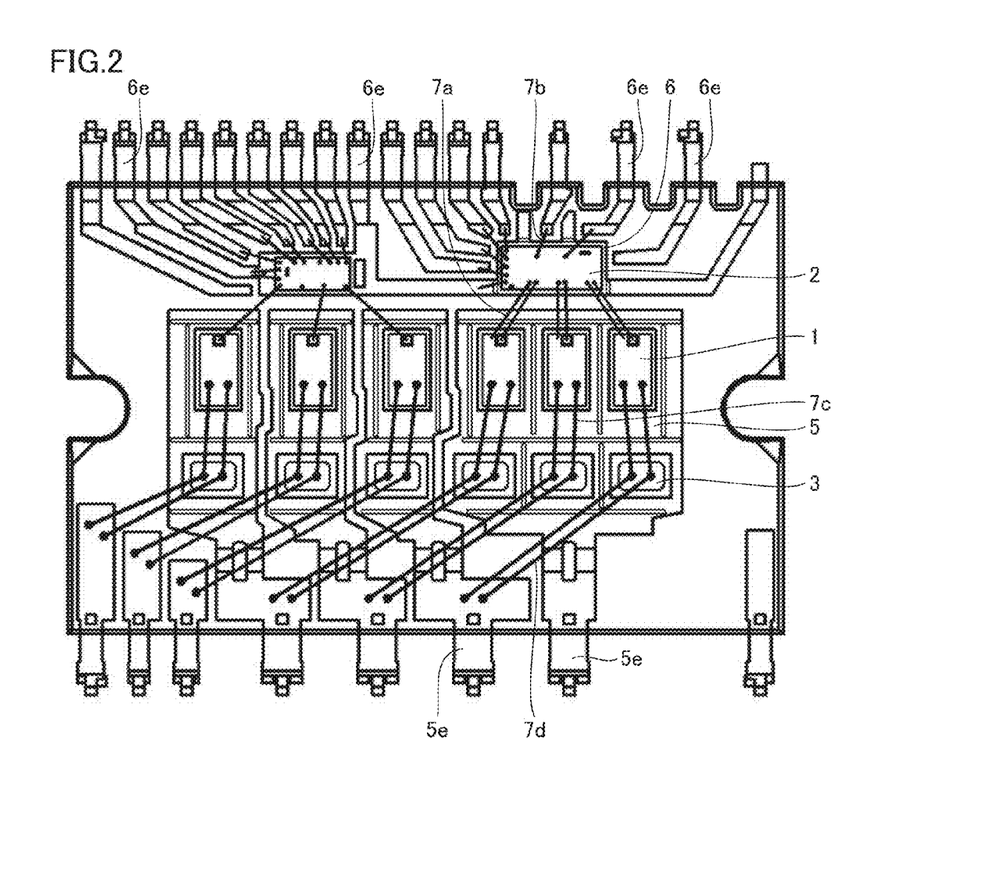
FIG. 2 is a plan diagram schematically illustrating the configuration of the power semiconductor device according to the first embodiment of the present invention.

Referring to FIGS. 1 and 2, a configuration of a power semiconductor module according to a first embodiment will be described. A power semiconductor module 10 according to the first embodiment mainly includes an IGBT 1, an IC (Integrated Circuit) 2, an FWDi (Free Wheeling Diode) 3, a first frame portion 5, a second frame portion 6, a wire 7a, and an insulator portion 4.

The first frame portion 5 has a first surface 5a and a second surface 5b opposed to each other. Power semiconductor elements such as IGBT 1 and FWDi 3 are mounted on first surface 5a of first frame portion 5. IGBT 1 and FWDi 3 are each joined to first surface 5a, for example, with a joint member such as solder.

The second frame portion 6 has a third surface 6a and a fourth surface 6b opposed to each other. IC 2 that is a control integrated circuit for controlling the power semiconductor elements is mounted on third surface 6a of second frame 6. The back surface of IC 2 is joined to third surface 6a, for example, with a joint member such as solder. Second frame portion 6 may serve as a ground potential. As shown in FIG. 2, two ICs 2 may be mounted on one second frame portion 6. A temperature sensor may be contained in IC 2.

IGBT 1 and IC 2 are directly electrically connected with each other by wire 7a. Wire 7a has one end and the other end. The one end is connected to IGBT1 and the other end is connected to IC 2. Wire 7a is arranged to extend between first frame portion 5 and the second frame. As shown in FIG. 2, three IGBTs 1 may be connected to one IC by wires 7a. One or more than one wires 7a may be provided. IGBT 1 and FWDi 3 are also electrically connected with each other by wires 7c. FWDi 3 may be electrically connected with first frame portion 5 by a wire 7d or may be electrically connected with another frame different from first frame portion 5. IC 2 may be electrically connected with second frame portion 6 by a wire 7b or may be electrically connected with another frame different from second frame portion 6. Wires 7a to 7d are formed of a material, for example, including gold or may be, for example, aluminum. The use of aluminum, which is cheaper than gold, can reduce manufacturing costs of power semiconductor module 10.

Insulator portion 4 seals IGBT 1, FWDi 3, IC 2, first frame portion 5, second frame portion 6, and wires 7a to 7d. Insulator portion 4 is formed of, for example, resin but may be ceramic or the like.

As shown in FIG. 1, first surface portion 5a of first frame portion 5 and third surface 6a of second frame portion 6 are located at the same height in the direction vertical to first surface 5a of first frame portion 5 (that is, the up-down direction in FIG. 1). In the present invention, the same height means that the distance between first surface 5a and third surface 6a in the direction vertical to first surface 5a is 0.1 mm or less. That is, first surface 5a may be located closer to an insulating sheet 11 by 0.1 mm or less or may be located further from insulating sheet 11 by 0.1 mm or less than third surface 6a.

Each of first frame portion 5 and second frame portion 6 is bended in the direction vertical to first surface 5a of first frame portion 5 in the inside of insulator portion 4. First frame portion 5 emerges from a left surface portion 4c of insulator portion 4 to the outside of insulator portion 4 and connects to a terminal portion 5e. Similarly, second frame portion 6 emerges from a right surface portion 4d of insulator portion 4 to the outside of insulator portion 4 and connects to a terminal portion 6e. First frame portion 5 and terminal portion 5e may be integrally formed or may be separate. Similarly, second frame portion 6 and terminal portion 6e may be integrally formed or may be separate.

Power semiconductor module 10 according to the present embodiment has insulating sheet 11 in contact with second surface 5b of first frame portion 5 and fourth surface 6b of second frame portion 6. Preferably, insulating sheet 11 entirely covers second surface 5b and fourth surface 6b. A metal plate 12 is arranged in contact with the surface of insulating sheet 11 that is opposite to the surface in contact with first frame portion 5. Metal plate 12 is exposed from insulator portion 4. A heat sink fin 8 is provided in contact with a lower surface 4b of insulator portion 4 and metal plate 12.

A method of manufacturing a power semiconductor module according to the present embodiment will now be described with reference to FIGS. 1, 2, and 14 to 16.

Figure 14:
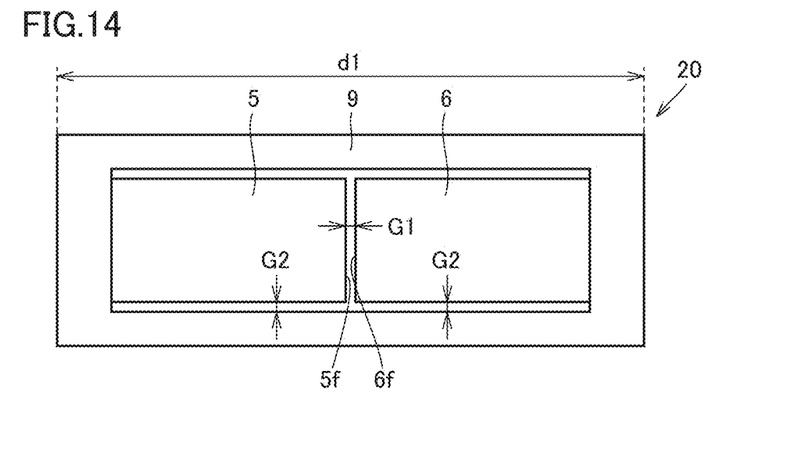
FIGS. 14 and 15 are schematic plan diagrams illustrating the steps of a method of manufacturing the power semiconductor device according to the first embodiment of the present invention.

First, referring to FIG. 14, a frame preparation step is carried out. Specifically, a metal frame 20 having an H-shaped notch portion formed at the center is prepared. Frame 20 has first frame portion 5 having a first end surface 5f and second frame portion 6 having a second end surface 6f facing first end surface 5f with a gap G1 interposed therebetween. Frame 20 has a third frame portion 9 that is arranged at each side portion of first frame portion 5 and second frame portion 6 with a gap G2 interposed and couples first frame portion 5 and second frame portion 6.

Next, a step of mounting a power semiconductor element on first frame portion 5 and a step of mounting a control integrated circuit for controlling the power semiconductor element on second frame portion 6 are carried out. Specifically, IGBT 1 and FWDi are mounted on first surface 5a of first frame portion 5, and IC 2 is mounted on third surface 6a of second frame portion 6.

Figure 15:
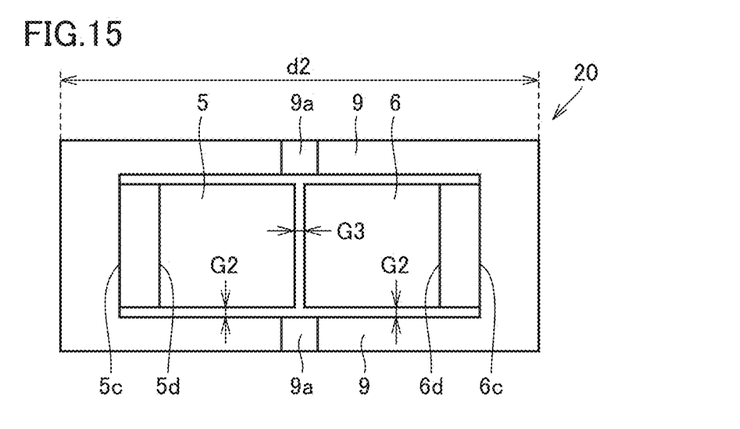
Figure 16:
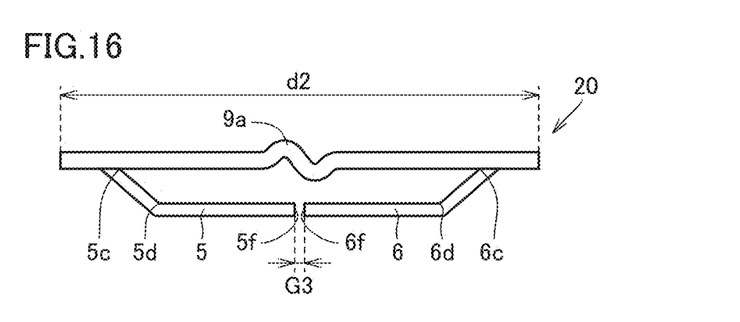
FIG. 16 is a cross-sectional diagram schematically illustrating the second step of the method of manufacturing the power semiconductor device according to the first embodiment of the present invention.

Referring to FIGS. 15 and 16, a frame bending step is carried out. Specifically, first frame portion 5 and second frame portion 6 are bent with respect to third frame portion 9 in a direction crossing third frame portion 9, and third frame portion 9 is shrunken in a direction in which first end surface 5f and second end surface 6f face each other. Shrinking third frame portion 9 means that the width of frame 20 is reduced from a width d1 to a width d2. As shown in FIG. 16, a curved portion 9a may be formed in the vicinity of the center of third frame portion 9 by shrinking third frame portion 9.

First frame portion 5 is bent at a first bend portion 5c toward insulating sheet 11 and bent at a second bend portion 5d opposite to insulating sheet 11. Similarly, second frame portion 6 is bent at a first bend portion 6c toward insulating sheet 11 and bent at a second bend portion 6d opposite to insulating sheet 11. After being bent, first frame portion 5 and second frame portion 6 are located at the same height in the direction normal to first surface 5a (that is, in the up-down direction in FIG. 16). Third frame portion 9 that connects first frame portion 5 and second frame portion 6 is thereafter removed whereby first frame portion 5 and second frame portion 6 are electrically isolated from each other.

Referring to FIG. 1, a wire bonding step is carried out. Specifically, wire 7a having one end and the other end is used so that one end of wire 7a is connected to IGBT 1 and the other end of wire 7a is connected to IC 2. IGBT 1 and IC 2 are thus directly electrically connected with each other by wire 7a. IGBT 1 and FWDi 3 are electrically connected by wire 7c. FWDi 3 and first frame portion 5 may be electrically connected by wire 7d. In addition, IC 2 and second frame portion 6 may be electrically connected by wire 7b.

Next, a molding step is carried out. Specifically, IGBT 1, FWDi 3, IC 2, first frame 5, second frame portion 6, and wires 7a to 7d are sealed with insulator portion 4 formed of resin.

In the foregoing description, the frame bending step is carried out after the step of mounting the power semiconductor element and the step of mounting the control integrated circuit. However, the step of mounting the power semiconductor element and the step of mounting the control integrated circuit may be carried out after the frame bending step.

The operation and effects of the first embodiment according to the present invention will now be described.

Power semiconductor module 10 according to the first embodiment has wire 7a coupling the power semiconductor element and the control integrated circuit, and first surface 5a of first frame portion 5 having the power semiconductor element mounted thereon and third surface 6a of second frame portion 6 having the control integrated circuit mounted thereon are located at the same height. This can alleviate stress exerted on the end portion of wire 7a and thus stabilizes the loop of wire 7a thereby preventing a disconnection of wire 7a and wire 7a from short-circuiting with the other frame. In addition, wire 7a is prevented from flowing when insulator portion 4 is molded. In a case where a temperature sensor is mounted on the control integrated circuit, the accuracy of the temperature sensor can be improved because the distance between the temperature sensor and the power semiconductor element is short.

Power semiconductor module 10 according to the first embodiment further includes insulating sheet 11 in contact with second surface 5b of first frame portion 5 and fourth surface 6b of second frame portion 6. Accordingly, heat can be dissipated efficiently through second surface 5b and fourth surface 6b.

According to the method of manufacturing power semiconductor module 10 according to the first embodiment, first frame portion 5 and second frame portion 6 are bent with respect to third frame portion 9, and third frame portion 9 is shrunken in the direction in which first end surface 5f and second end surface 6f face each other. This can minimize the distance between the power semiconductor element and the control integrated circuit in the direction parallel to first surface 5a and minimize the distance between the power semiconductor element and the integrated control circuit in the direction vertical to the first surface.

Second Embodiment

Figure 3:
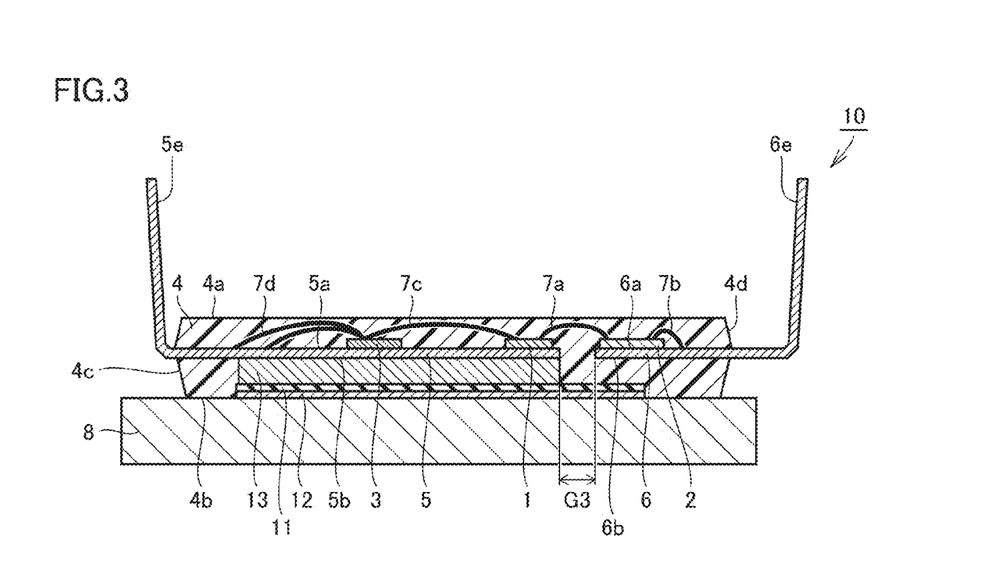
FIG. 3 is a cross-sectional diagram schematically illustrating a configuration of a power semiconductor device according to a second embodiment of the present invention.
Figure 5:
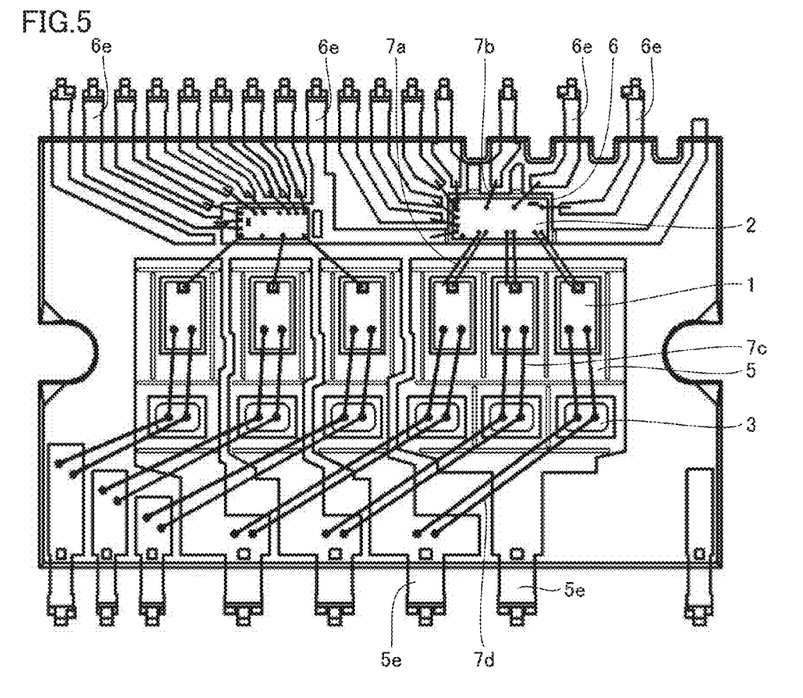
FIG. 5 is a plan diagram schematically illustrating the configuration of the power semiconductor device according to the second and third embodiments of the present invention.

Referring to FIGS. 3 and 5, a configuration of a power semiconductor module according to a second embodiment will now be described. The configuration of power semiconductor module 10 according to the second embodiment differs from the configuration of the power semiconductor module according to the first embodiment in that a block portion 13 made of copper is arranged between first frame portion 5 and insulating sheet 11. The other configuration is the same as the first embodiment.

In power semiconductor module 10 according to the second embodiment, block portion 13 made of copper is arranged in contact with second surface 5b of first frame portion 5 and insulating sheet 11. First frame portion 5 having IGBT 1 and FWDi 3 mounted thereon and second frame portion 6 having IC 2 mounted thereon are located at the same height in the direction normal to first surface 5a of the first frame portion. Second frame portion 6 is in contact with insulating sheet 11 with insulator portion 4 interposed therebetween.

Power semiconductor module 10 according to the second embodiment has block portion 13 in contact with second surface 5b of first frame portion 5. Accordingly, first surface 5a of first frame portion 5 and third surface 6a of second frame portion 6 can be positioned at the same height in the direction vertical to first surface 5a without bending second frame portion 6 in the inside of insulator portion 4. As a result, the loop of wire 7a coupling the power semiconductor element and the control integrated circuit can be stabilized.

In power semiconductor module 10 according to the second embodiment, the material of block portion 13 includes copper. Accordingly, heat generated by the power semiconductor element can be efficiently diffused to the outside.

Third Embodiment

Figure 4:
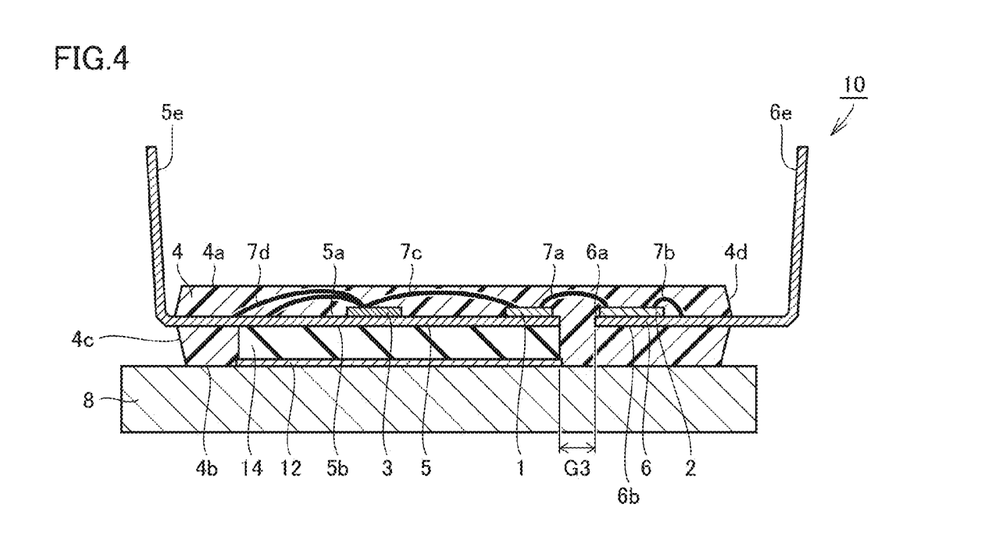
FIG. 4 is a cross-sectional diagram schematically illustrating a configuration of a power semiconductor device according to a third embodiment of the present invention.

Referring to FIGS. 4 and 5, a configuration of a power semiconductor module according to a third embodiment will be described. The configuration of the power semiconductor module according to the third embodiment differs from the configuration of the power semiconductor module according to the second embodiment in that block portion 13 has a DBC (Direct Bonded Copper) structure because of inclusion of ceramic. The other configuration is the same as the second embodiment.

The DBC has a ceramic base arranged between two copper plates and bonded to the copper plates. Specifically, power semiconductor module 10 according to the third embodiment has a block portion arranged between first frame portion 5 made of copper and metal plate 12 made of copper. The block portion is formed of a ceramic base 14 of aluminum oxide ($Al_2O_3$), aluminum nitride (AlN), or the like. First frame portion 5 having IGBT 1 and FWDi 3 mounted thereon and second frame portion 6 having IC 2 mounted thereon are located at the same height in the direction normal to first surface 5a of the first frame portion. Second frame portion 6 is in contact with insulating sheet 11 with insulator portion 4 interposed therebetween.

In power semiconductor module 10 according to the third embodiment, the material of block portion 13 includes ceramic. This can reduce the weight of power semiconductor module 10.

Fourth Embodiment

Figure 6:
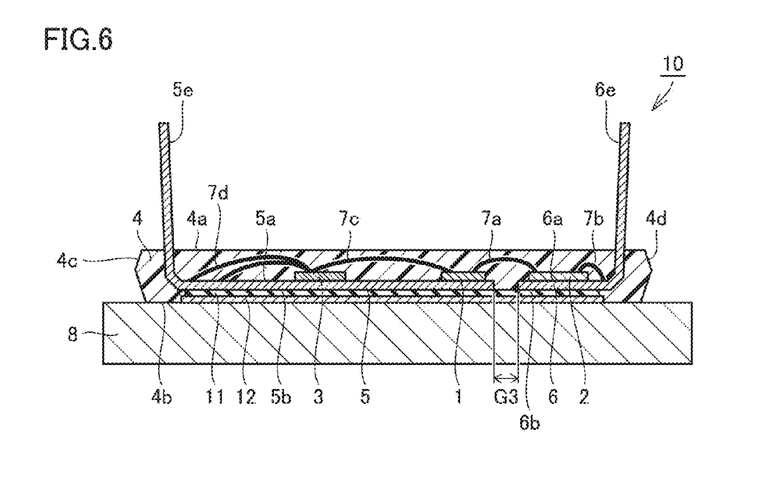
FIG. 6 is a cross-sectional diagram schematically illustrating a configuration of a power semiconductor device according to a fourth embodiment of the present invention.
Figure 7:
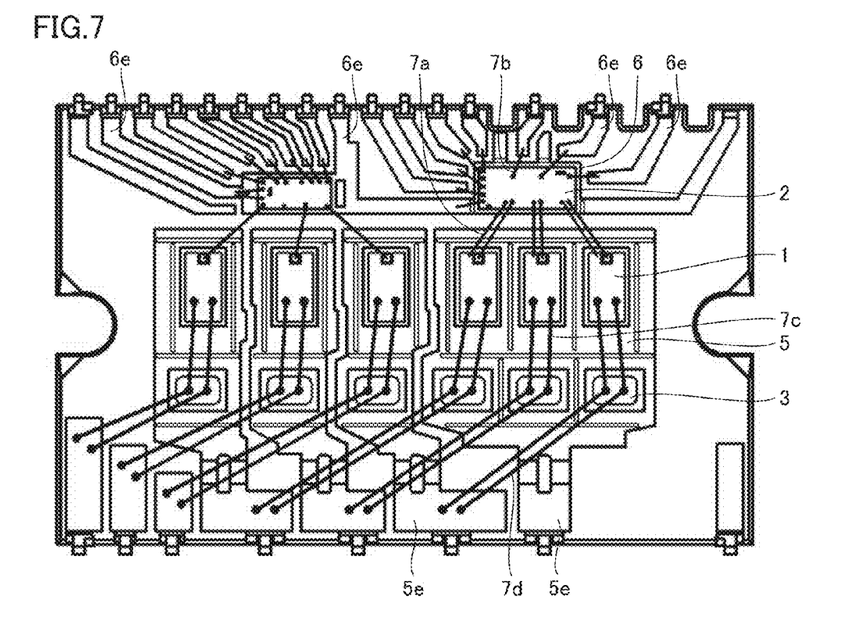
FIG. 7 is a plan diagram schematically illustrating the configuration of the power semiconductor device according to the present invention.

Referring to FIGS. 6 and 7, a configuration of a power semiconductor module according to a fourth embodiment will be described. The configuration of the power semiconductor module according to the fourth embodiment differs from the configuration of the power semiconductor module according to the first embodiment in that at least one of first frame portion 5 and second frame portion 6 emerges to the outside of the insulator portion from upper surface 4a of insulator portion 4 on the side facing first surface 5a. The other configuration is the same as the first embodiment.

Specifically, first frame portion 5 in power semiconductor module 10 according to the fourth embodiment is bent toward upper surface 4a of insulator portion 4 in the inside of insulator portion 4. First frame portion 5 emerges to the outside of insulator portion 4 through upper surface 4a of insulator portion 4. Similarly, second frame portion 6 is bent toward upper surface 4a of insulator portion 4 in the inside of insulator portion 4. Second frame portion 6 emerges to the outside of insulator portion 4 through upper surface 4a of insulator portion 4. In FIG. 6, first frame portion 5 and second frame portion 6 each emerges to the outside through upper surface 4a of insulator portion 4. In the present invention, however, one of first frame portion 5 and second frame portion 6 may pass through upper surface 4a of insulator portion 4 and the other may pass through left surface portion 4c or right surface portion 4d of insulator portion 4 to emerge to the outside.

In power semiconductor module 10 according to the fourth embodiment, at least one of first frame portion 5 and second frame portion 6 emerges to the outside of insulator portion 4 from upper surface 4a of insulator portion 4 that faces first surface 5a. This increases the distance between first frame portion 5 and second frame portion 6, and heat sink fin 8 thereby improving the insulation between first frame portion 5 and second frame portion 6, and heat sink fin 8.

Fifth Embodiment

Figure 8:
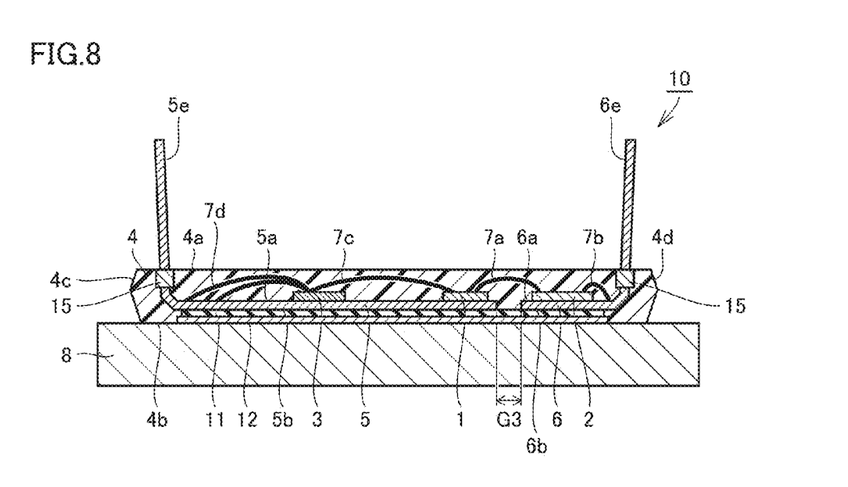
FIG. 8 is a cross-sectional diagram schematically illustrating a configuration of a power semiconductor device according to a fifth embodiment of the present invention.
Figure 9:
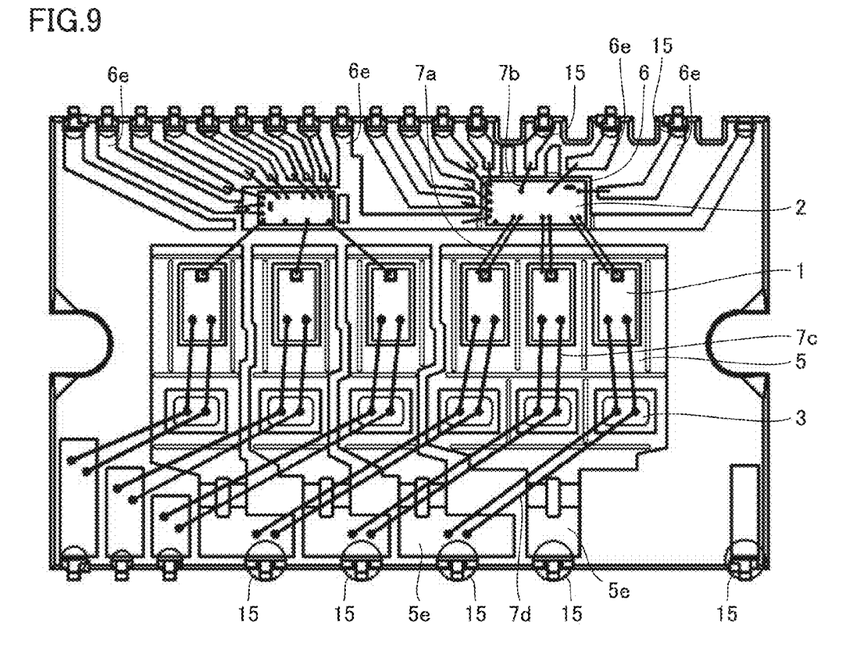
FIG. 9 is a plan diagram schematically illustrating the configuration of the power semiconductor device according to the fifth embodiment of the present invention.

Referring to FIGS. 8 and 9, a configuration of a power semiconductor module according to a fifth embodiment will be described. The configuration of the power semiconductor module according to the fifth embodiment differs from the configuration of the power semiconductor module according to the first embodiment in that at least one of first frame portion 5 and second frame portion 6 has a connector pin 15 at a position exposed from insulator portion 4 to the outside. The other configuration is the same as the first embodiment.

Specifically, in power semiconductor module 10 according to the fifth embodiment, first frame portion 5 and second frame portion 6 each have a connector pin 15. As shown in FIG. 8, connector pin 15 is partially exposed from upper surface 4a of insulator portion 4, and connector pin 15 is connected with terminal portion 5e. First frame portion 5 and terminal portion 5e are thus electrically connected with each other. Similarly, connector pin 15 is connected with terminal portion 6e. Accordingly, second frame portion 6 and terminal portion 6e are thus electrically connected with each other. Terminal portion 5e and terminal portion 6e extend in the direction crossing upper surface 4a of insulator portion 4. In FIG. 6, first frame portion 5 and second frame portion 6 each have connector pin 15. In the present invention, however, one of first frame portion 5 and second frame portion 6 may have connector pin 15, and the other may not have connector pin 15.

In power semiconductor module 10 according to the fifth embodiment, at least one of first frame portion 5 and second frame portion 6 has connector pin 15 at a position exposed from insulator portion 4 to the outside. First frame portion 5 and second frame portion 6 are formed as frames without terminals, and terminal portions 5e and 6e are attached thereto through connector pins 15 in the subsequent step, whereby power semiconductor module 10 having terminal portions different in shape can be manufactured efficiently. With first frame portion 5 and second frame portion 6 formed as frames without terminals, a multi-row frame, for example, in a staggered arrangement can be formed.

Sixth Embodiment

Figure 10:
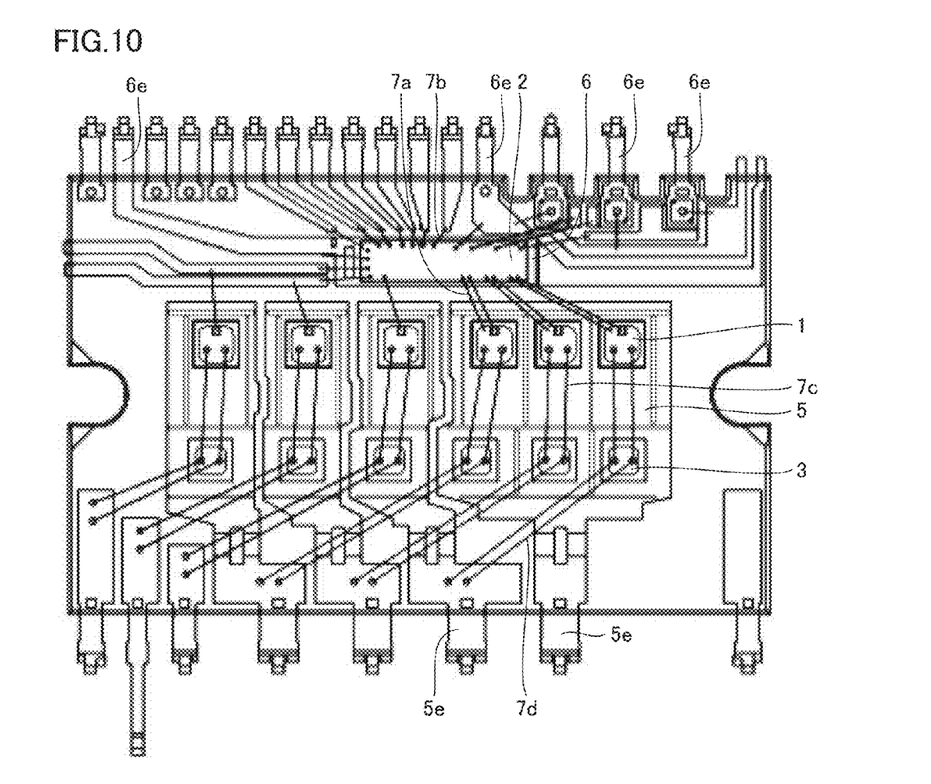
FIG. 10 is a plan diagram schematically illustrating a configuration of a power semiconductor device according to a sixth embodiment of the present invention.

Referring to FIG. 10, a configuration of a power semiconductor module according to a sixth embodiment will be described. The configuration of the power semiconductor module according to the sixth embodiment differs from the configuration of the first embodiment in that IC 2 is a single chip. The other configuration is the same as the first embodiment.

Specifically, in power semiconductor module 10 according to the sixth embodiment, a single IC 2 mounted on second frame portion 6 is provided to be able to control a plurality of IGBTs 1. Conventionally, two IGBTs 1 mounted above and below are controlled by separate ICs 2, so that mutual operation timings cannot be controlled. In power semiconductor module 10 according to the sixth embodiment, two IGBTs 1 arranged above and below are controlled in the inside of IC 2 so as not to operate simultaneously, thereby achieving a function as an interlock (safety device).

Seventh Embodiment

Figure 11:
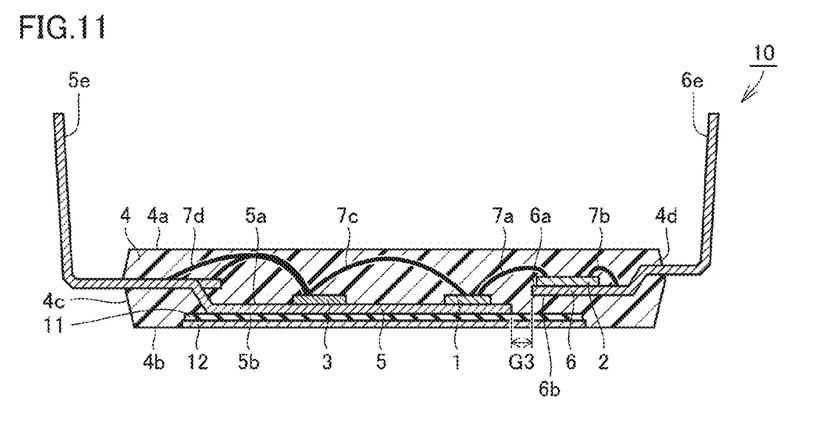
FIG. 11 is a cross-sectional diagram schematically illustrating a configuration of a power semiconductor device according to a seventh embodiment of the present invention.
Figure 12:
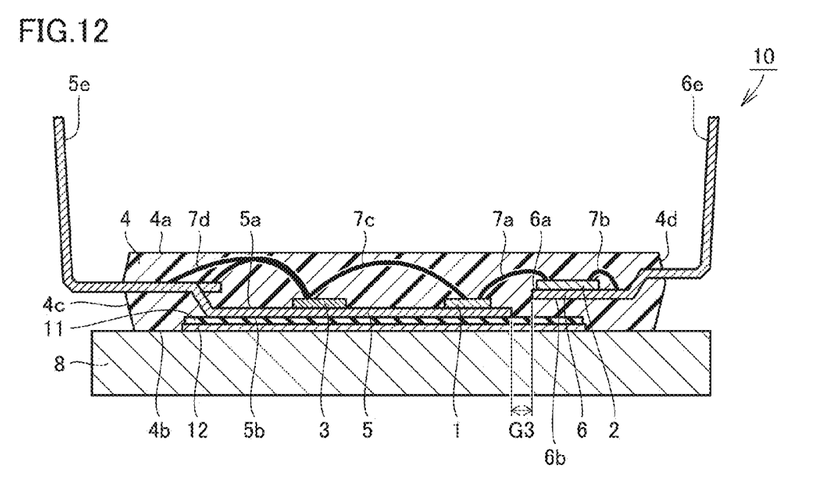
FIG. 12 is a cross-sectional diagram schematically illustrating the configuration of the power semiconductor device according to the seventh embodiment of the present invention.
Figure 13:
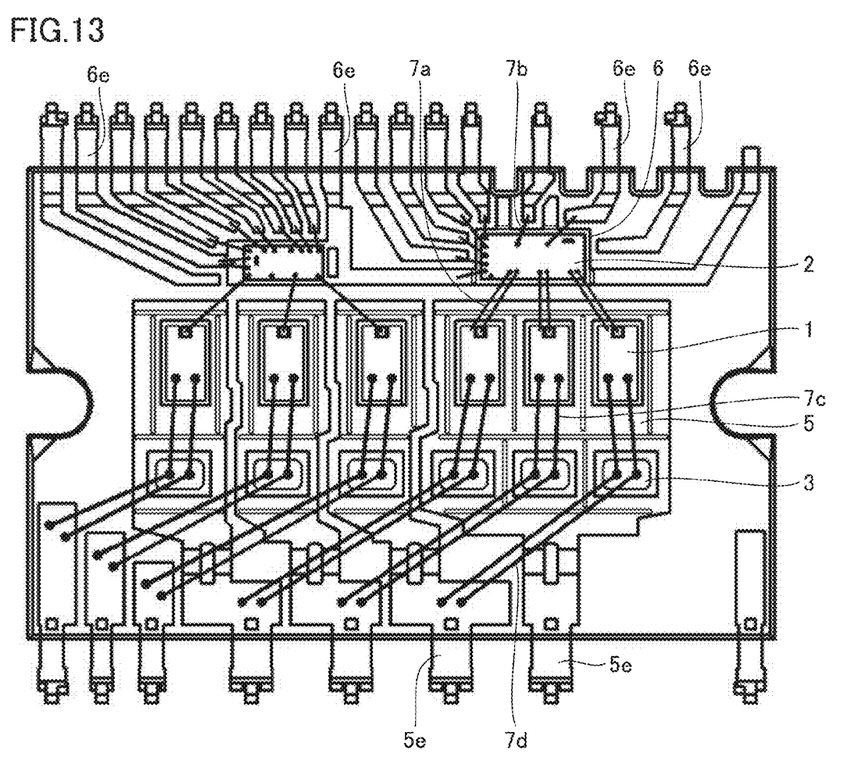
FIG. 13 is a plan diagram schematically illustrating the configuration of the power semiconductor device according to the seventh embodiment of the present invention.

Referring to FIGS. 11 to 13, a configuration of a power semiconductor module according to a seventh embodiment will be described. The configuration of the power semiconductor module according to the seventh embodiment differs from the configuration of the power semiconductor module according to the first embodiment in that second frame portion 6 and insulating sheet 11 are not in direct contact with each other, and that second frame portion 6 is located closer to upper surface 4a of insulator portion 4 than first frame portion 5. The other configuration is the same as the first embodiment. A method of manufacturing the power semiconductor module according to the seventh embodiment is similar to the manufacturing method in the first embodiment.

In power semiconductor module 10 according to the seventh embodiment, insulator portion 4 is arranged between fourth surface 6b of second frame portion 6 and insulating sheet 11. Second frame portion 6 is bent in the inside of insulator portion 4 in the direction crossing first surface 5a of first frame portion 5. First frame portion 5 having IGBT 1 and FWDi 3 mounted thereon is arranged closer to insulating sheet 11 than second frame portion 6 having IC 2 mounted thereon. That is, in the power semiconductor module according to the seventh embodiment, the distance between first surface 5a of first frame portion 5 and third surface 6a of second frame portion 6 may not be the same in the direction vertical to first surface 5a.

In power semiconductor module 10, metal plate 12 in contact with insulating sheet 11 may be exposed to the outside of insulator portion 4 as shown in FIG. 11. Preferably, as shown in FIG. 12, heat sink fin 8 is provided in contact with metal plate 12 and lower surface 4b of insulator portion 4.

In power semiconductor module 10 according to the seventh embodiment, second frame portion 6 is bent in the inside of insulator portion 4 in the direction crossing first surface 5a. This can reduce the distance between first frame portion 5 and second frame portion 6 in the direction vertical to first surface 5a, thereby stabilizing the loop of wire 7a coupling the power semiconductor element and the control integrated circuit. As a result, a disconnection of wire 7a or a shirt circuit can be prevented.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A power semiconductor module comprising:
   a first frame portion having a first surface and a second surface opposed to each other;
   a power semiconductor element mounted on said first surface of said first frame portion;
   a second frame portion having a third surface and a fourth surface opposed to each other;
   a control integrated circuit directly mounted on said third surface of said second frame portion for controlling said power semiconductor element;

a wire having one end and the other end, said one end connected to said power semiconductor element and said the other end connected to said control integrated circuit; and an insulator portion sealing said power semiconductor element, said first frame portion, said control integrated circuit, said second frame portion, and said wire, said first surface of said first frame portion and said third surface of said second frame portion being located at a same height in a direction vertical to said first surface of said first frame portion.

2. The power semiconductor module according to claim 1, further comprising an insulating sheet in contact with said second surface of said first frame portion and said fourth surface of said second frame portion.

3. The power semiconductor module according to claim 1, further comprising a block portion in contact with said second surface of said first frame portion.

4. The power semiconductor module according to claim 3, wherein a material of said block portion includes copper.

5. The power semiconductor module according to claim 3, wherein a material of said block portion includes ceramic.

6. The power semiconductor module according to claim 1, wherein at least one of said first frame portion and said second frame portion emerges to an outside of said insulator portion from a surface of said insulator portion that is located on a side facing said first surface.

7. The power semiconductor module according to claim 6, wherein at least one of said first frame portion and said second frame portion has a connector pin at a position exposed from said insulator portion to said outside.

8. The power semiconductor module according to claim 1, wherein a material of said wire includes aluminum.

9. A power semiconductor module, comprising:
a first frame portion having a first surface and a second surface opposed to each other;
a power semiconductor element mounted on said first surface of said first frame portion;
a second frame portion having a third surface and a fourth surface opposed to each other;
a control integrated circuit directly mounted on said third surface of said second frame portion for controlling said power semiconductor element;
a wire having one and the other end, said one end connected to said power semiconductor element and said the other end connected to said control integrated circuit; and
an insulator portion sealing said power semiconductor element, said first frame portion, said control integrated circuit, said second frame portion, and said wire,
said second frame portion being bent inside said insulator portion in a direction crossing said first surface.

* * * * *